United States Patent [19]
Yokota et al.

[11] Patent Number: 5,239,172
[45] Date of Patent: Aug. 24, 1993

[54] LIGHT CONVERGING FILTER AND METHOD FOR MANUFACTURING THE SAME

[75] Inventors: Toshio Yokota; Hajime Mori, both of Tokyo, Japan

[73] Assignee: Dai Nippon Printing Co., Ltd., Tokyo, Japan

[21] Appl. No.: 689,878

[22] PCT Filed: Sep. 19, 1990

[86] PCT No.: PCT/JP90/01197
§ 371 Date: May 17, 1991
§ 102(e) Date: May 17, 1991

[87] PCT Pub. No.: WO91/04504
PCT Pub. Date: Apr. 4, 1991

[30] Foreign Application Priority Data
Sep. 20, 1989 [JP] Japan .................. 1-243950

[51] Int. Cl.$^5$ ............................... H01J 40/14
[52] U.S. Cl. ............................... 250/208.1; 357/30; 257/431
[58] Field of Search ............... 250/208.1, 226, 211 R, 250/211 J; 357/30 M, 30 H, 30 L; 358/213.13, 213.27, 482; 359/741

[56] References Cited

U.S. PATENT DOCUMENTS

| | | | |
|---|---|---|---|
| 4,667,092 | 5/1987 | Ishihara | 250/208.1 |
| 4,689,652 | 8/1987 | Shimada et al. | 357/30 M |
| 4,959,533 | 9/1990 | Yamazaki et al. | 250/208.1 |
| 5,081,346 | 1/1992 | Narabu et al. | 250/208.1 |

Primary Examiner—David C. Nelms
Assistant Examiner—K. Shami
Attorney, Agent, or Firm—Dellett, Smith-Hill and Bedell

[57] ABSTRACT

In a color filter or a monochromatic filter (4) to be used by bonding to imaging sensor (1), at least two resin layers (A) and (B) adjacent to each other on transparent substrate and having different refractive indices are furnished, and the boundary surface of these resin layers (A) and (B) is formed in such curved surface that incident light (7) is converged on each of the light receiving units (2) of imaging sensor. Therefore, light converging effect can be obtained even on a solid-state imaging device of bonding type, and the sensitivity can be increased.

To prepare light converging curved surface from the boundary surface where two resin layers (A) and (B) contact each other, there is a method, by which the desired curved surface is formed by selective exposure and hardening of light curing resin, and there is another method, by which a convex graded element is formed at first, and the surface thereof is formed in the desired convex form on the above convex graded element by selecting the coating condition in coating resin on it.

4 Claims, 11 Drawing Sheets

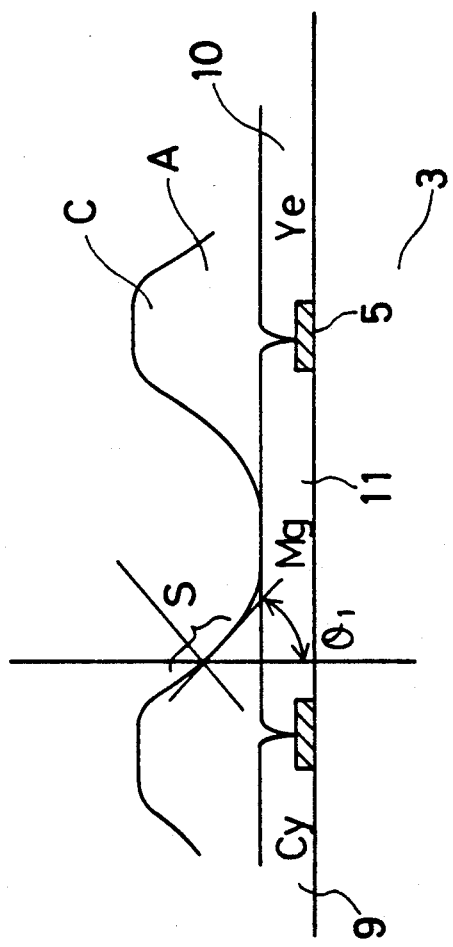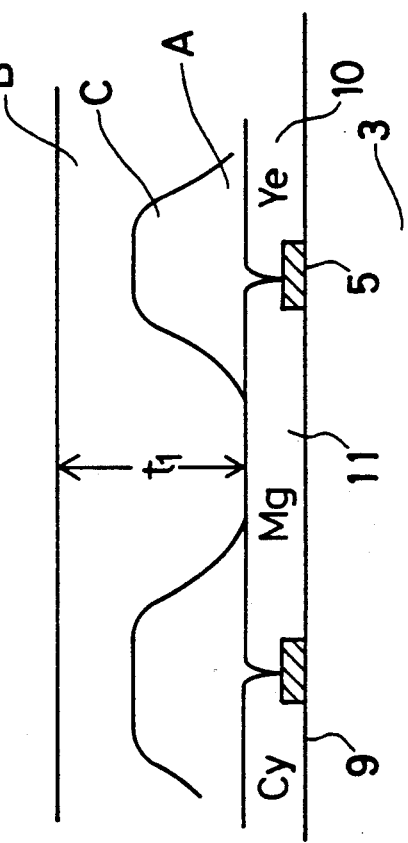

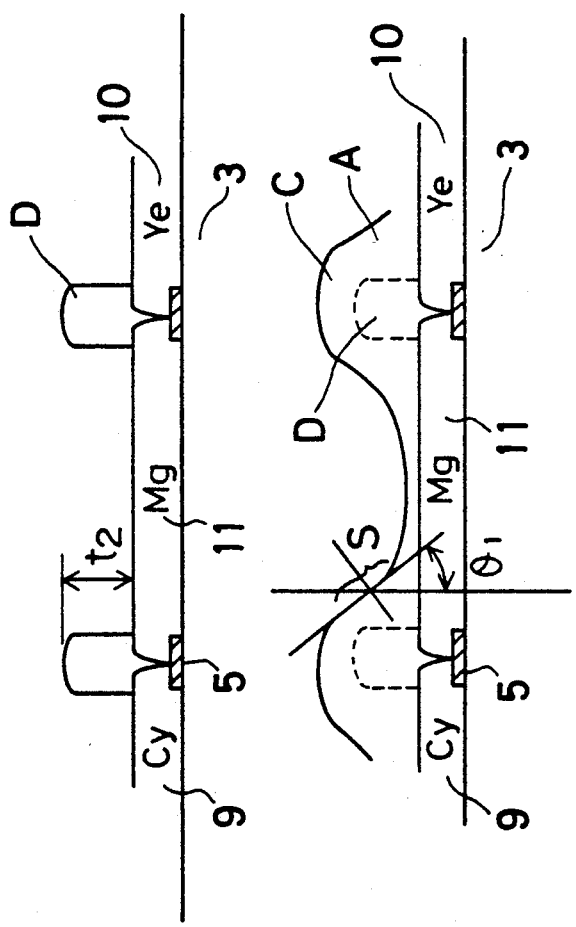

LIGHT CONVERGING FILTER AND METHOD FOR MANUFACTURING THE SAME

FIELD OF THE INVENTION

The present invention relates to the structure and the method for manufacturing of a filter in case a solid-state imaging device is produced by bonding imaging sensor with color filter or monochromatic filter by adhesive agent, and in particular to a light converging filter and the method for manufacturing the same for increasing converging efficiency to light receiving unit of imaging sensor.

BACKGROUND OF PRIOR ART

In the method for manufacturing a solid-state imaging device, there are two types of method: The method to form color filter directly on solid-state imaging sensor (on-chip method), and the method to form color filter on a transparent substrate such as glass substrate and to bond this with solid-state imaging sensor by adhesive agent (bonnding method).

In order to increase the sensitivity of solid-state imaging device, it has been attempted in recent years to mount lens on front surface of solid-state imaging sensor and to improve the efficiency by increasing the converging property to the light receiving unit. FIG. 9 shows a cross-sectional view of such solid-state imaging device. As shown in this figure, each of the pixels 53 of color filter 52 is arranged on the front surface of light receiving units 51 of CCD 50, and lenses 54 are provided in alignment with each pixel 53. As the material suitable for forming lenses on color filter 52, there are various types of photosetting or thermosetting resin. Because the difference of refractive indices between the air (refractive index $\approx 1$) and resin layer (refractive index $\approx 1.5$ to 1.6) is relatively big, it is possible to obtain high converging effect for incident light 55 coming directly to lens 55 through the air 56.

In contrast, the refractive index of the photosetting or thermosetting resin used as adhesive agent in the bonding method is 1.5 to 1.6, and the difference of refractive index from that of lens unit formed on solid-state imaging sensor is too small. Accordingly, if it is in the same arrangement as on-chip method, converging effect is not obtained almost at all.

The object of the present invention is to offer a light converging color filter or monochromatic filter to be used for the bonding method and a method for manufacturing converging filter to solve the above problems of the conventinal bonding method.

SUMMARY OF THE INVENTION

To attain the above object, the light converging filter according to the present invention is a color filter or monochromatic filter to be used on imaging sensor by bonding, and it is characterized in that there are provided at least two resin layers adjacent to each other on transparent substrate and having different refractive index, and that the boundary surfaces of these resin layers are prepared in such curved form that the incident light is converged to the light receiving units of imaging sensor.

In this case, typical arrangement is that a resin layer in convex form with relatively low refractive index is provided in alignment with upper or lower portion of a light shielding layer of color filter or monochromatic filter, and another resin layer with relatively high refractive index is furnished on the surface of the above resin layer.

According to the first method for manufacturing converging filter, photosetting resin is coated on a transparent substrate before or after forming the filter layer, and only the resin at the boundary of color element or at upper or lower portion of light shielding layer is hardened by exposing to light to prepare it in convex form. Then, another resin layer having higher refractive index than that of the above photosetting resin is coated and the surface is flattened.

In this case, it is preferable to adjust the inclination of the edge of convex portion formed through selective exposure and curing of photosetting resin by heating it to its softening point after light curing.

According to the second manufacturing method, photosetting resin is coated on a transparent substrate before or after the formation of filter layer, and only the resin at the boundary of color element or at upper or lower portion of the light shielding layer is hardened by exposing it to light to prepare convex graded element. Then, another resin layer with relatively low refractive index is coated on it in such selective manner that the surface is prepared in convex form on the above convex graded element. Next, another resin with higher refractive index than the resin with relatively low refractive index is coated, and the surface is flattened.

Further, according to another method, a light shielding layer is formed on a transparent substrate, and photosensitive resin is coated on it. By irradiating light uniformly from the direction of transparent substrate, convex graded element is formed so that only the resin on upper portion of light shielding layer remains. Next, the resin with relatively low refrative index is coated on it in such selective manner that its surface is prepared in convex form on the above convex graded element. Then, another resin layer with higher refractive index than that of the resin with relatively lower refractive index is coated on it, and the surface is flattened.

By the light converging filter according to the present invention, it is possible to obtain converging effect and to increase the sensitivity even in solid-state imaging device of bonding type because boundary surfaces of at least two resin layers adjacent to each other on transparent substrate and having different refractive indices are formed in curved surfaces to converge the incident light to each of light receiving units of the imaging sensor.

BRIEF DESCRIPTION OF THE DRAWINGS

FIG. 3a and b is to explain the manufacturing process of the Example 1 of this invention;

FIG. 7a–c shows the process of the manufacturing method of the Example 3 of this invention;

DETAILED DESCRIPTION OF PREFERRED EMBODIMENTS

The light converging filter according to the present invention is to be used for bonding type device, and converging effect is obtained by forming boundary surfaces of the materials with different refractive indices in lens form on lower or upper layer of color filter or monochromatic filter, using two types or more of the materials with different refractive indices.

Figure 10:
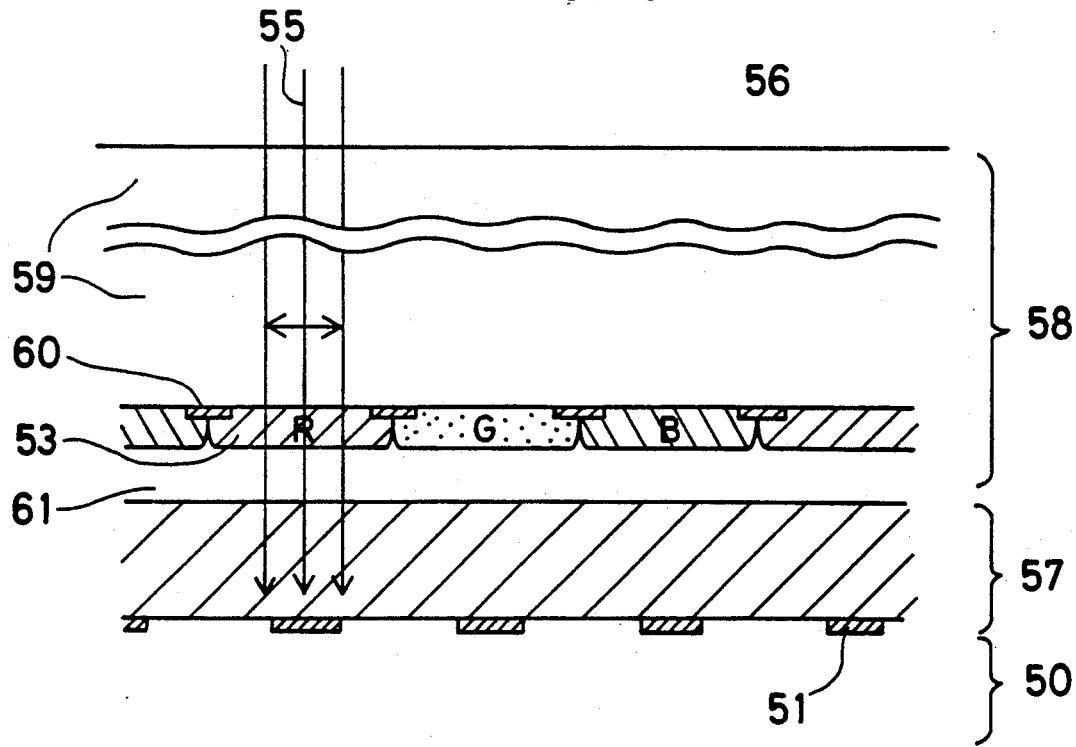
FIG. 10 is a cross-sectional view of a conventional type color filter bonded with solid-state imaging device.

FIG. 10 shows a cross-sectional view of a conventional type color filter 58 bonded together with a solid-state imaging sensor 50 by an adhesive layer 57. The light 55 coming through the surface of the glass 59 of color filter 58 advances straightly through pixels (dye layer) 53 of color filter 58 and enters the light receiving unit of CCD (charge coupled device imaging sensor) 50. The light receiving quantity is limited by the opening area ratio of the light receiving unit 51 of charge coupled device imaging sensor 50. In a typical solid-state imaging sensor (CCD), the opening area ratio is about 30%. Specifically, light can be received only by 30% of the incident light. (In FIG. 10, the symbol 60 indicates a light shielding layer, and 61 a protective layer.)

Figure 1:
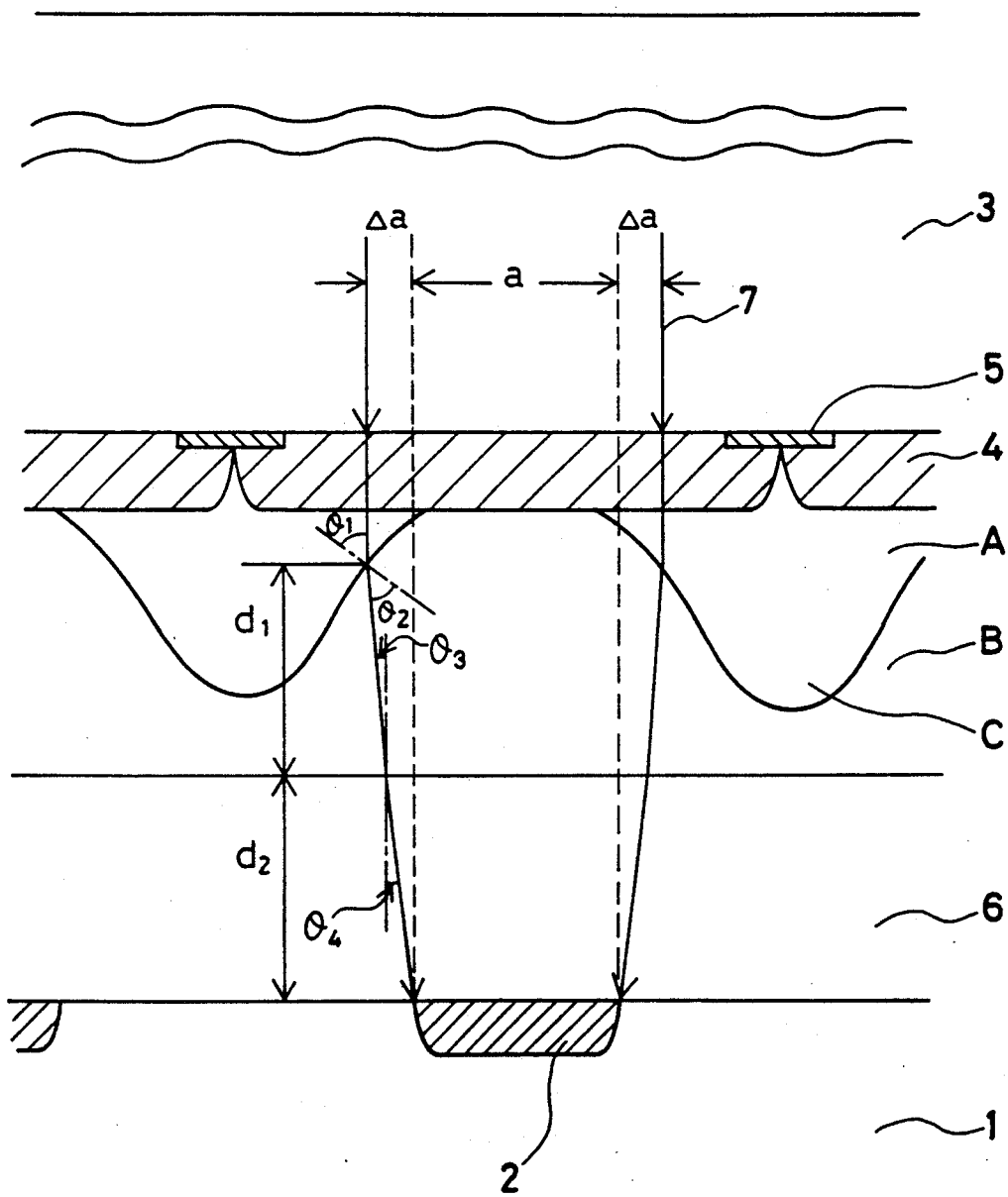
FIG. 1 is a partial cross-sectional view of a light converging filter according to the present invention bonded to a solid-state imaging device.

In the present invention, resin layer A (material with low refractive index) is coated on upper portion (shown at lower position in the figure, but at the upper position in the manufacturing process) of color separation layer (light shielding layer) 5 as shown in FIG. 1, and a lens-like portion C in convex form having an inclination toward the central portion of each pigment color element 4 is formed on the boundary portion of each color element 4.

Specifically, FIG. 1 is a partial cross-sectional view of converging filter of the present invention bonded to charge coupled device imaging sensor, where CCD 1 has a light receiving unit 2, on which color elements 4 formed on a glass substrate 3 are bonded with resin layer A, resin layer B and adhesive layer 6 therebetween in alignment with the light receiving unit 2. Light shielding layer 5 is furnished between the adjoining color filter elements 4. The resin layer A has the biggest thickness at the light shielding layer 5, and has the smallest thickness at the center of the color filter element. (In the figure, thickness is zero.) Therefore, a lens-like portion C is formed of the resin layer A, on convex form with predetermined inclination toward the central portion of each color filter element 4, on the boundary of each color filter element 4. On the resin layer A (at lower position in the figure), resin layer B (material with high refractive index) is provided to fill the uneven surface of the resin layer A. By bonding the above-mentioned filter thus arranged to CCD 1 by the adhesive layer 6, converging effect can be obtained. The reasons are as follows:

When it is supposed that the incident angle of the light 7 coming from the direction of the glass 3 to the normal line on boundary surface between the resin layers A and B is $\theta_1$, the refractive angle $\theta_2$ is obtained from the difference of refractive indices as follows:

$$\sin \theta_2 = n_A/n_B \sin \theta_1 \quad (1)$$

As it is evident from the equation (1), in case the difference of the refractive indices of the resin layers A and B is: $n_A < n_b$, $\theta_2 < \theta_1$. Thus, the incident light is converged toward the direction of the light receiving unit 2. In this case, the converging area is determined by the optical path length $d_1$ passing through the resin layer B and the incident angle $\theta_3$ ($\theta_3 = \theta_1 - \theta_2$) on the boundary surface between resin layer B and adhesive layer 6.

Next, according to the same principle, the incident angle $\theta_3$ becomes $\theta_4$ on the adhesive layer 6 (with refractive index of $n_C$) on the boundary surface of resin layer B and adhesive layer 6 by the following equation (2):

$$\sin \theta_4 = n_B/n_C \sin \theta_3 \quad (2)$$

By the equation (2), the difference of refractive indices of resin layer B and adhesive layer 6 is $\theta_4 > \theta_3$ in case $n_C < n_B$.

In this case, the converging area is determined by the thickness $d_2$ of the adhesive layer 6 and by refractive angle $\theta_4$.

Therefore, total converging area relative to one side is:

$$\Delta a = d_1 \cdot \tan \theta_3 + d_2 \cdot \tan \theta_4$$

Figure 2:
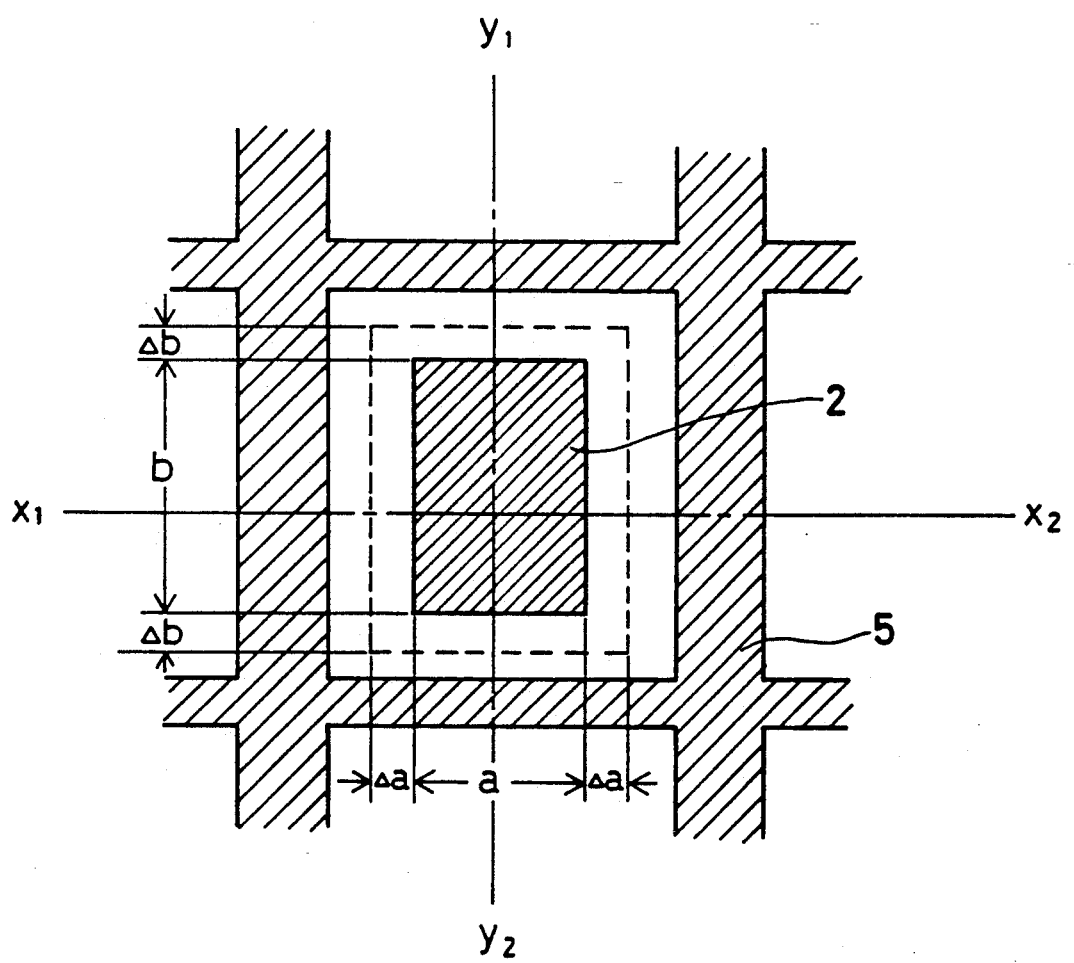
FIG. 2 is a plan view of a part of FIG. 1.

As evident from the plan view of FIG. 2, the converging efficiency in 2-dimensional area is:

$$(a + 2\Delta a) \times (b + 2\Delta b)/a \cdot b$$

(The incident light coming to the area enclosed by dotted line of FIG. 2 is converged to the light receiving unit 2. The converging area of the cross-section $y_1 - y_2$ is the increment for the area $\Delta b$ relative to one side according to the same principle as on the cross-section $x_1 - x_2$.)

From the above principle, the conditions for enlarging the converging area are as follows:

The refractive index of the resin layer B must be higher than the refractive index of the resin layer A.

The refractive index of the adhesive layer 6 must be smaller than that of the resin layer B.

The angle of the boundary surface between resin layer A and the resin layer B must be such adequate angle that light is converged efficiently to the opening (light receiving unit) 2 of the image sensor. (This adequate angle is determined by the difference of refractive indices between resin layer A and resin layer B, film thickness of resin layer B (optical path length), difference of refractive indices between resin layer B and adhesive layer 6, thickness of adhesive layer, and light receiving area of the light receiving unit 2).

It is desirable that the boundary surface between resin layer B and adhesive layer 6 is made smoother at the point of refractive angle.

The above principle has been explained in the case where light converging layers A and B are provided on upper portion of color filter element 4, whereas converging effect can be obtained in the same way when light converging layers A and B are provided on the glass 3 (at lower portion of color filter element 4; at upper portion in FIG. 1).

In the above, the element 4 has been described as color element of color filter, whereas the light converging effect can be obtained by the same principle in case of monochromatic filter (with light shielding layer 5 only on the glass 3).

According to the first manufacturing method of light converging filter, filter layer 4 is formed on a glass substrate 3, and photosetting resin A is coated on it. By exposing only the resin on upper portion of the light shielding layer 5 to harden, lens-like portion C is formed, and the resin layer B is then coated. In this case, the inclination of the edge of lens-like portion Ca can be adjusted by heating it to its softening point after light curing. In this method, the material used as the resin A must have transparency with photosensitivity. Gelatin, casein, PVA, ammonium dichromate type photosensitive materials, and general acrylic photosensitive materials can be used. As the resin B, polyimide type or silicone type meterials are applicable as the material with high refractive index.

In the following, examples of the first manufacturing method are described:

EXAMPLE 1

As shown in FIG. 3 (a), chromium film of 0.1 μm thick was formed on a transparent glass substrate 3 by chromium sputtering. Then, this film was processed by resist pattern processing, etching and film detaching, and chromium shielding layer 5 in stripe of 2 μm wide was formed.

Next, photosensitive solution consisting of aqueous solution of gelatin/ammonium dichromate was coated, and patterning was performed by masking exposure and development. After stained with cyan, cyan element 9 was prepared by fixation.

By repeating the same process, yellow element 10 and magenta element 11 were prepared by yellow dyeing and magenta dyeing.

Gelatin photosensitive solution was coated on it, and the element A in 5 μm graded form was prepared by proximity exposure on chromium stripe 5. When the 1 convex portion C was examined by electron microscope, the angle $\theta_1$ of the area S in FIG. 3 (a) was about 60 degrees.

Next, polyimide resin B was coated on it, and the surface was flattened as shown in FIG. 3 (b).

Figure 4:
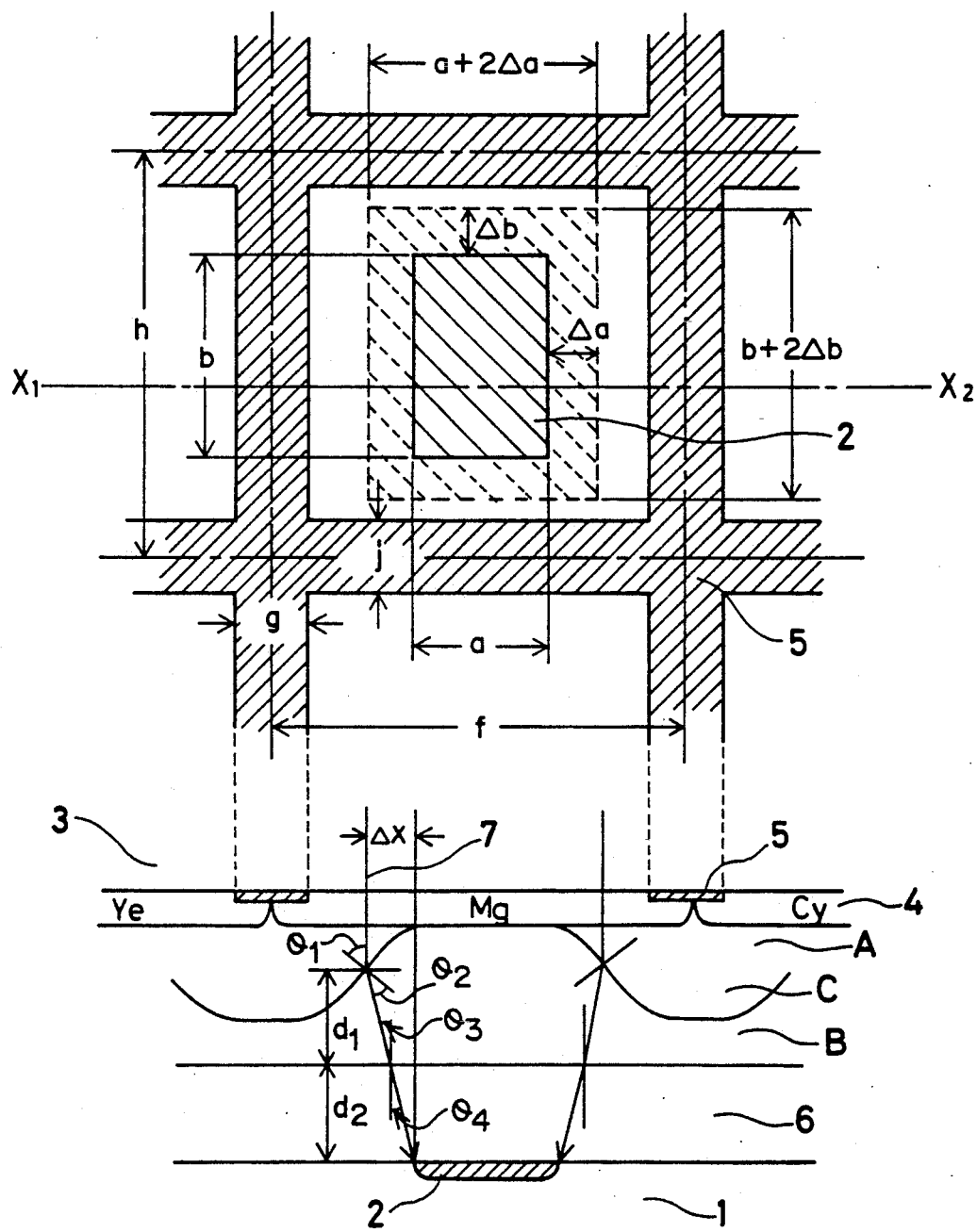
FIG. 4 shows a plan view and a cross-sectional view of a converging filter manufactured by the method of the Example 1 bonded on a solid-state imaging device.
Figure 5A:
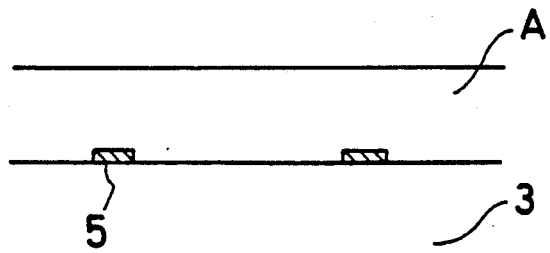
FIG. 5a–e shows the process of the manufacturing method of the Example 2.
Figure 5B:
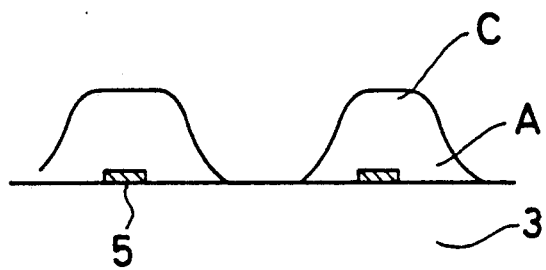
Figure 5C:
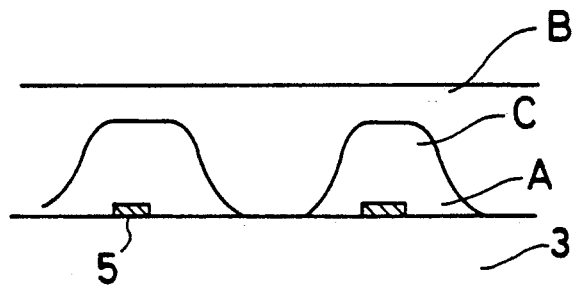
Figure 5D:
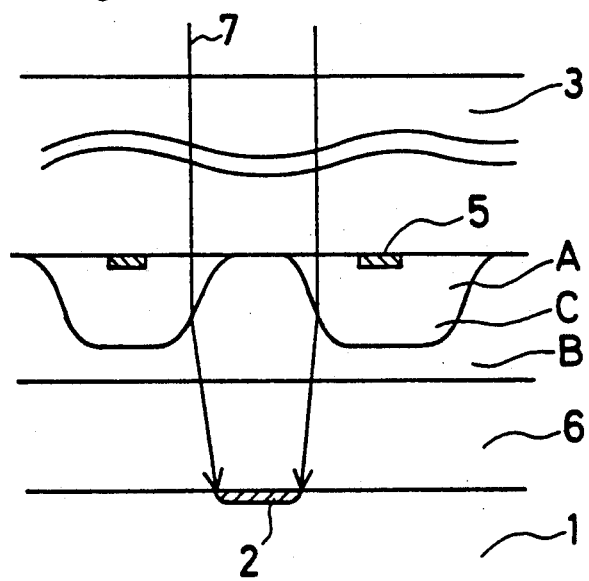
Figure 5E:
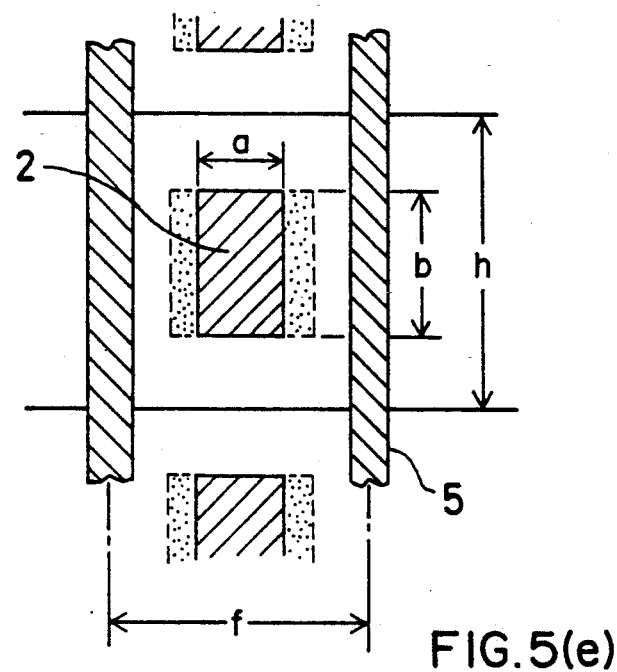

The converging filter thus prepared was cut off and was bonded with CCD element, using acrylic adhesive agent 6 to prepare imaging sensor. The refractive indices of gelatin hardened film A, polyimide film B, and acrylic adhesive layer 6 measured by Abbe's refractometer were 1.56, 1.70 and 1.50 respectively. FIG. 4 shows a plan view and a cross-sectional view of major portion after bonding ($X_1$ - $X_2$ of plan view). As the result, as given by numerical values in FIG. 4, the substantial incident light area (indicated by dotted line in the plan view) relative to CCD light receiving portion 5 with area of 24 $\mu m^2$ increased to 56 $\mu m^2$, and the sensitivity has also doubled.

EXAMPLE 2

As shown in FIG. 5 (a), chromium stripe 5 was formed on a transparent glass substrate 3 of 0.5 mm thick. On this chromium stripe 5, photosensitive solution A consisting of casein/ammonium dichromate was coated, and the stripe (convex portion) C as shown in FIG. 5 (b) was formed by proximity exposure. The refractive index of this resin A was 1.55.

Next, as shown in FIG. 5 (c), silicone type resin (refractive index 1.68) was coated on it, and the surface was smoothened to prepare monochromatic filter.

As shown in FIG. 5 (d) (cross-sectional view) and (e) (plan view), this filter was bonded to CCD 1 by photosetting acrylic adhesive agent (refractive index 1.53) 6, and the sensitivity was measured. It was possible to increase the sensitivity by about 1.5 times.

In the above, the first manufacturing method of converging filter according to the present invention has been described. In this method, the formation of lens-like form is important. It is not very easy to manufacture converging filter by giving inclination to edge portion of the convex portion C through exposure system or control of irradiation quantity using photosetting resin or by heating the hardened resin up to the softening point and by controlling the form of the edge stably in order to form lens-like form by the resin A. When lens is formed by this method, there are some restrictions to the material of the resin A because of the edge form after light curing or heat softening property, and the scope of material selection is limited, including the conditions such as adequate refractive index, transmittance, etc.

Figure 6:
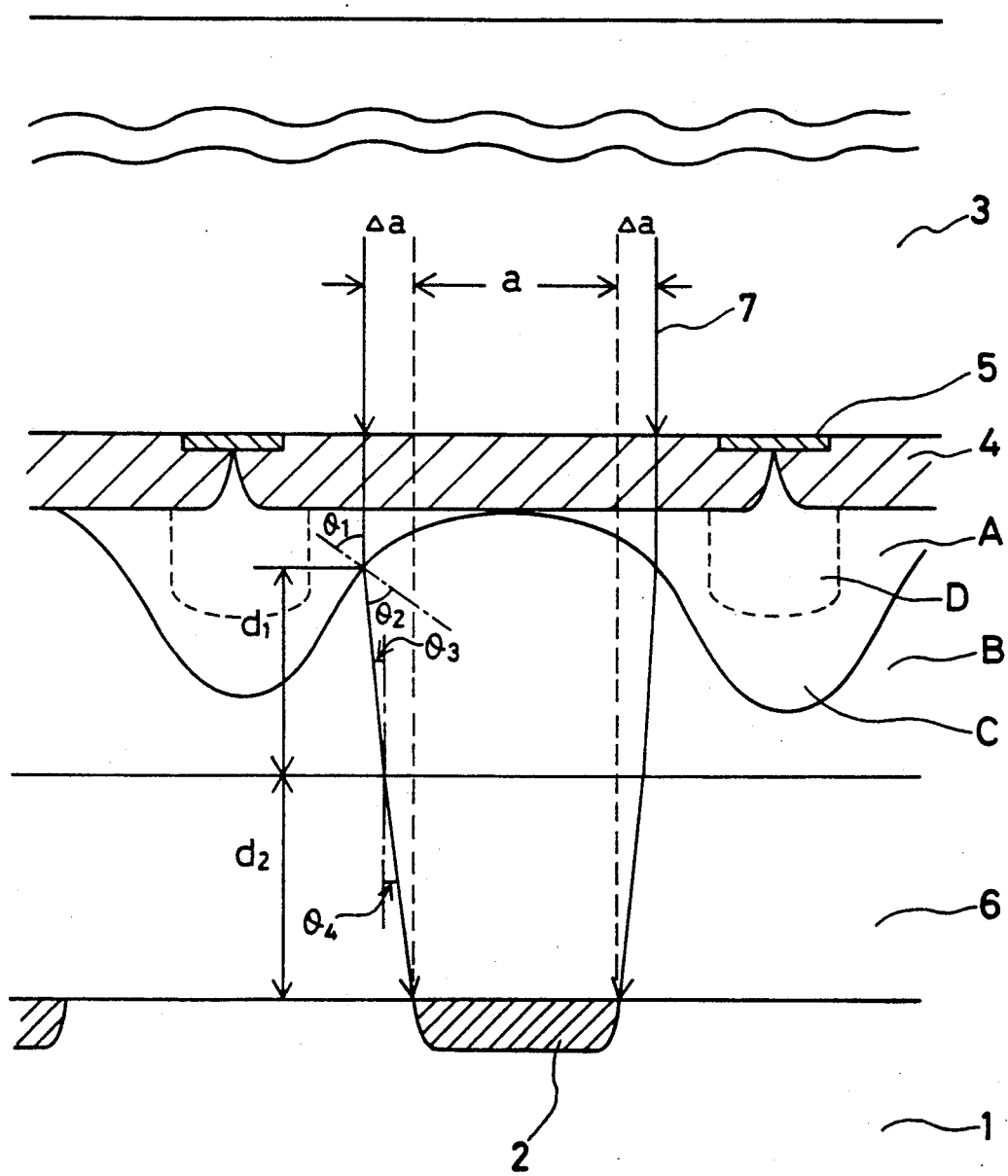
FIG. 6 is the same drawing as FIG. 1 for explaining the second manufacturing method of this invention.
Figure 8A:
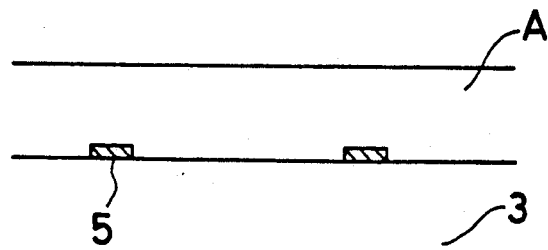
FIG. 8a–e is to explain the process of the manufacturing methods of the Examples 4 and 5 of this invention.
Figure 8B:
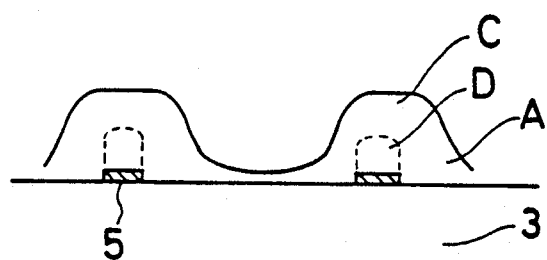
Figure 8C:
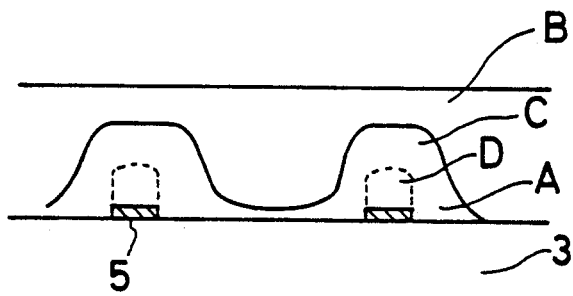
Figure 8D:
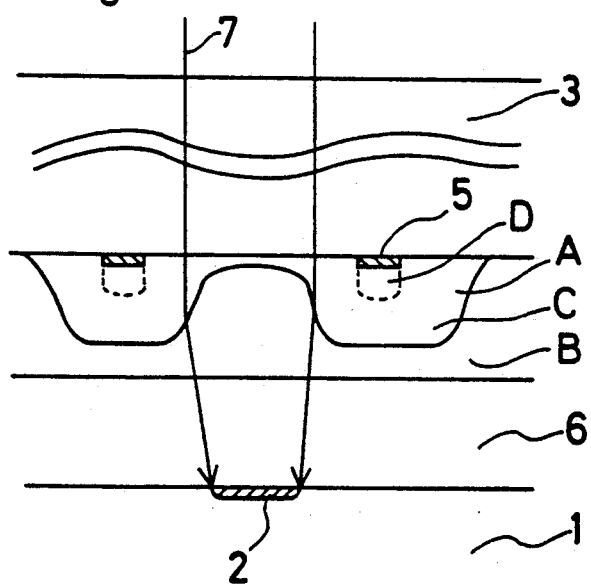
Figure 8E:
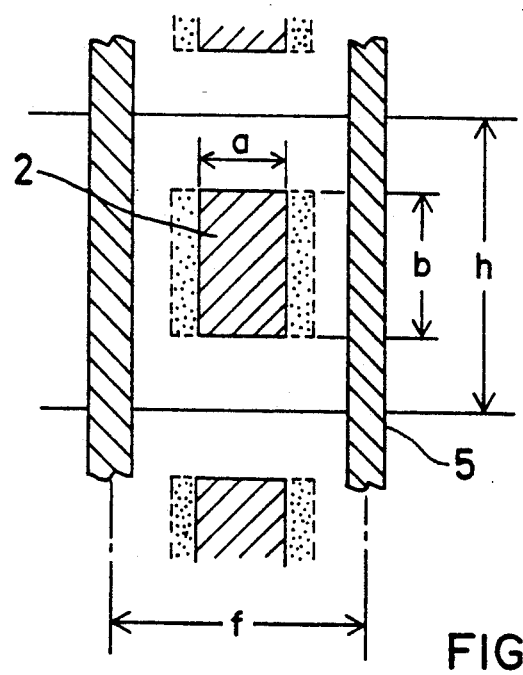
Figure 9:
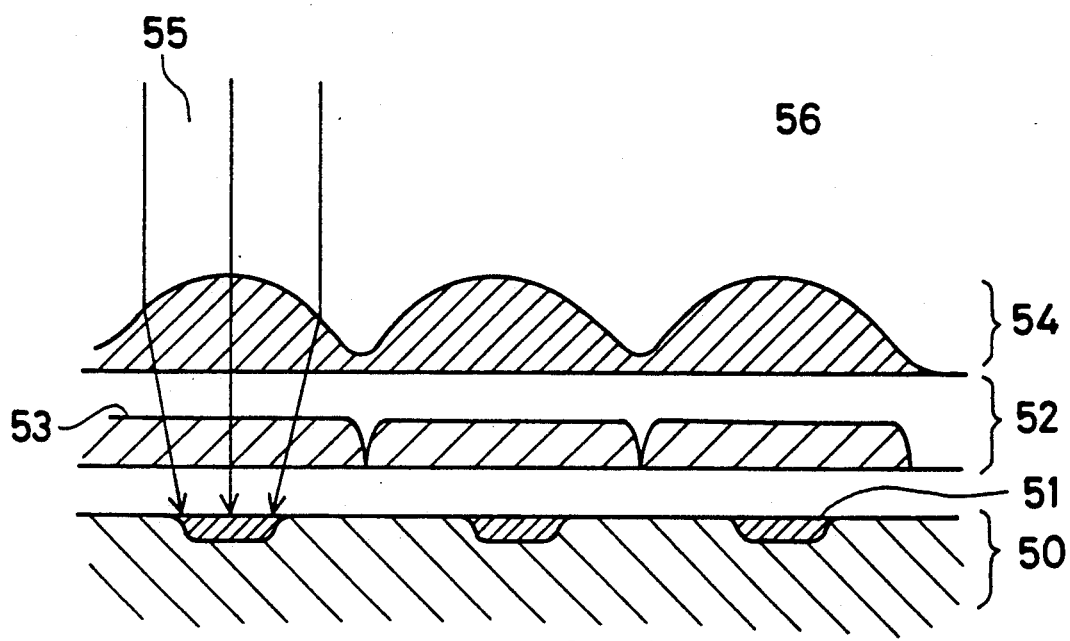
FIG. 9 is a cross-sectional view showing the case where lenses are directly formed on the front surface of a solid-state imaging device of conventional on-chip type.

Now, description is given on the second manufacturing method of converging filter of this invention to solve the above problems in connection with FIG. 6. (FIG. 6 is a drawing similar to FIG. 1, in which the same components are referred by the same symbols.)

By this method, to obtain stably control and manufacture lens-like form, first graded element is formed of the resin D on filter layer 4 which is formed on a glass substrate 3, and then the resin A is coated on it.

In this case, the shape of the lens C can be controlled according to film thickness of the resin D, the viscosity of the resin A and coating conditions. The resin D is a photosensitive resin, generally used for patterning. As the resin A, general photosetting or thermosetting resin satisfying the required optical property can be used.

Description is now given on this method when lens is formed on color filter. As shown in FIG. 6, shielding layer 5 and color filter element 4 are formed on a glass 3. On the upper portion of the shielding layer 5, graded element D is formed by patterning, using resin with sensitivity to gelatin, casein or PVA or using resin commercially available. In this case, the condition and system of the exposure may be the adequate conditions for patterning to photosensitive resin. There is no need to control the inclination of the edge portion.

On the graded element D thus patterned, the resin A with low refractive index is coated, and the inclination of the edge of convex portion C as desired is obtained. In this case, film thickness of the graded element D, viscosity of the resin A, and the number of coating rotations are important factors to determine the inclination of edge portion. This resin A can be selected primarily according to refractive index and transmittance if photosetting or thermosetting conditions are satisfied. If the difference of refractive index from the resin B is big, higher converging effect can be obtained. As the resin with refractive index of about 1.5, there is wide range of selection including acrylic resin, urethane, acryl-styrene resin, epoxy resin, etc. The procedure of formation after the resin B is the same as the first manufacturing method.

In the following, the examples of the second manufacturing method are described.

EXAMPLE 3

As shown in FIG. 7 (a), chromiun grid 5 was formed on a substrate 3 of 0.5 mm thick, and mosaic color filters 9 to 11 were prepared by dyeing. On these color filters, graded element D was prepared by patterning in thickness of 5 μm on the chromium grid 5, using FVR resist (manufactured by Fuji Chemical Co., Ltd.). Then, acryl-urethane resin (refractive index: 1.55) was applied by spin coating at 3000 rpm. By heating it at 150° C. for one hour, a convex portion C was hardened. (See FIG. 7 (b).) When the convex portion C was observed by electron microscope, the inclination $\theta 1$ of edge region (region S in the figure) of FIG. 7 (b) was about 60 degrees.

Next, polymide resin with refractive index of 1.70 was applied by spin coating at 800 rpm. The surface was flattened, and the resin layer B was formed.

This filter was bonded to CCD imaging sensor 1 by an adhesive layer 6 with refractive index 1.50, and this was used as imaging sensor. (See FIG. 4.) Thus, the sensitivity about twice as high as that of the conventional product was obtained.

EXAMPLE 4

As shown in FIG. 8, a shielding layer 5 by chromium was formed by patterning on a transparent glass substrate 3 of 0.5 mm thick. After coating gelatin/ammonium dichromate photosensitive solution on it (See FIG. 8 (a)), the graded element D of 4.5 μm was formed by stepper exposure. The refractive index of this resin D was 1.56 (FIG. 8 (b)). Next, urethane resin (refractive index: 1.56) was applied by spin coating, and lens-like portion C was prepared by heat curing at 150° C. for 30 minutes. The unevenness on the surface was 4 μm (FIG. 8 (b)).

Next, polyimide resin B was applied by spin coating, and monochromatic lens filter was prepared by heat curing at 180° C. for 3 hours (FIG. 8 (c)).

After bonding to CCD image sensor 1, the sensitivity about 1.5 times as high as that of the conventional product was obtained, and converging effect was confirmed (FIG. 8 (d) (cross-section); FIG. 8 (e) (plan view).

EXAMPLE 5

As shown in FIG. 8, a shielding layer 5 by chromium was formed by patterning on a transparent glass substrate 3 of 0.5 mm thick, and OFPR 800 500 cps was applied by spin coating at 3000 rpm. Without using mask, exposure was performed from the direction of glass substrate 3 and it was developed. Thus, the graded element D of 5 μm was obtained.

Next, after applying epoxy resin by spin coating, heat curing was performed at 150° C. for 30 minutes, and lens-like portion C was formed. The graded step on the surface was 4 μm.

Next, polyimide resin B was applied by spin coating. Heat curing was performed at 180° C. for 3 hours, and monochromatic lens filter was prepared.

After bonding to CCD imaging sensor 1, the sensitivity was about 1.5 times higher than the conventional product, and light converging effect was confirmed.

In the above, the example of the present invention have been described, whereas the invention is not limited to these examples, and various modifications can be conceived.

In color filter or monochromatic filter to be used by bonding to imaging sensor, at least two resin layers adjacent to each other on transparent substrate and having different refractive indices are furnished, and the boundary surface between these resin layers is formed in such curved surface that incident light is converged to each of the light receiving units of imaging sensor. Thus, it is possible to obtain the same converging effect as on-chip type by relatively increasing the difference of refractive indices, by controlling the shape of curved surface, and by decreasing the refractive index of adhesive agent for bonding to lower than the refractive index of the adhesive surface of the filter.

By the manufacturing method according to the present invention, it is possible to easily manufacture light converging filter. Particularly, by the second method, it is possible to stably control the lens-like form, and the wide selection of the usable resin can be obtained.

APPLICABILITY IN THE INDUSTRY

The light converging filter and the method for manufacturing the same according to the present invention can be applied in the field of solid-state imaging device, in which imaging sensor is bonded together with color filter or monochromatic filter by adhesive agent.

What is claimed is:

1. A light converging filter for bonding to an imaging device, said light converging filter comprising:
    a transparent substrate;
    a light shielding layer formed on said transparent substrate;
    a convex graded element formed on the upper side of said light shielding layer in alignment with it, said convex graded element having a resin layer of relatively low refractive index which is convex toward the upper side of said light shielding layer, and a resin layer of relatively high refractive index over said low refractive index resin layer so that a level surface is formed;
    a bonding layer for bonding said substrate to the imaging device at a side thereof where said convex graded element is provided, said bonding layer having a refractive index lower than that of said high refractive index resin layer; and
    an interface between said low refractive index resin layer and said high refractive index resin layer, which is formed in a curved surface that converges incident light passing through the light shielding layer.

2. A light conveying filter according to claim 1, comprising a color filter layer between the substrate and the convex graded element.

3. An article of manufacture comprising an imaging device and a light converging filter bonded thereto, and wherein said light converging filter comprises:
    a transparent substrate;
    a light shielding layer formed on said transparent substrate;
    a convex graded element formed on the upper side of said light shielding layer in alignment with it, said convex graded element having a resin layer of relatively low refractive index which is convex toward the upper side of said light shielding layer, and a resin layer of relatively high refractive index over said low refractive index resin layer so that a level surface is formed;
    a bonding layer bonding said substrate to said imaging device at a side thereof where said convex graded element is provided, said bonding layer having a refractive index lower than that of said high refractive index resin layer; and an interface between said low refractive index resin layer and said high refractive index resin layer, which is formed in a curved surface that converges incident light onto said imaging device.

4. A light conveying filter according to claim 3, comprising a color filter layer between the substrate and the convex graded element.

* * * * *